(12) United States Patent
Liang

(10) Patent No.: US 9,941,234 B2
(45) Date of Patent: Apr. 10, 2018

(54) INTEGRATED PACKAGING OF MULTIPLE DOUBLE SIDED COOLING PLANAR BOND POWER MODULES

(71) Applicant: UT-Battelle, LLC, Oak Ridge, TN (US)

(72) Inventor: Zhenxian Liang, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 15/159,860

(22) Filed: May 20, 2016

(65) Prior Publication Data

US 2016/0351468 A1    Dec. 1, 2016

Related U.S. Application Data

(60) Provisional application No. 62/167,371, filed on May 28, 2015.

(51) Int. Cl.
*H01L 23/367* (2006.01)
*H01L 23/00* (2006.01)
(Continued)

(52) U.S. Cl.
CPC .......... *H01L 24/32* (2013.01); *H01L 23/3677* (2013.01); *H01L 23/3735* (2013.01); *H01L 23/4006* (2013.01); *H01L 23/473* (2013.01); *H01L 23/5385* (2013.01); *H01L 24/33* (2013.01); *H01L 25/18* (2013.01); *H01L 23/467* (2013.01); *H01L 24/05* (2013.01); *H01L 24/29* (2013.01); *H01L 24/83* (2013.01);
(Continued)

(58) Field of Classification Search
CPC ... H01L 2924/12032; H01L 2224/8383; H01L 24/33; H01L 23/367
USPC ................ 361/690, 704, 701; 257/E25.026; 165/83, 267; 62/3.7
See application file for complete search history.

(56) References Cited

U.S. PATENT DOCUMENTS 5,818,107 A    10/1998 Pierson et al.
6,611,057 B2    8/2003 Mikubo et al.
(Continued)

FOREIGN PATENT DOCUMENTS

JP    2012212776    11/2012

OTHER PUBLICATIONS

Kinya Nakatsu, et al., Next-Generation Inverter Technology for Environmentally Conscious Vehicles. Hitachi Review, 2012, pp. 254-258, vol. 61, No. 6.
(Continued)

*Primary Examiner* — Mandeep S Buttar
(74) *Attorney, Agent, or Firm* — Colin L. Cini

(57) ABSTRACT

An integrated double sided cooled power module has one or multiple phase legs configuration including one or more planar power packages, each planar power package having an upper power switch unit and a lower power switch unit directly bonded and interconnected between two insulated power substrates, and further sandwiched between two heat exchangers via direct bonds. A segmented coolant manifold is interposed with the one or more planar power packages and creates a sealed enclosure that defines a coolant inlet, a coolant outlet and a coolant flow path between the inlet and the outlet. A coolant circulates along the flow path to remove heat and increase the power density of the power module.

14 Claims, 14 Drawing Sheets

(51) Int. Cl.
*H01L 23/473* (2006.01)
*H01L 25/18* (2006.01)
*H01L 23/373* (2006.01)
*H01L 23/40* (2006.01)
*H01L 23/538* (2006.01)
*H01L 23/467* (2006.01)
*H02M 7/00* (2006.01)

(52) U.S. Cl.
CPC ........... *H01L 2224/04026* (2013.01); *H01L 2224/05639* (2013.01); *H01L 2224/05644* (2013.01); *H01L 2224/05655* (2013.01); *H01L 2224/291* (2013.01); *H01L 2224/29139* (2013.01); *H01L 2224/32* (2013.01); *H01L 2224/32227* (2013.01); *H01L 2224/32245* (2013.01); *H01L 2224/33181* (2013.01); *H01L 2224/8383* (2013.01); *H01L 2224/8384* (2013.01); *H01L 2224/83424* (2013.01); *H01L 2224/83447* (2013.01); *H01L 2224/83801* (2013.01); *H01L 2224/83825* (2013.01); *H01L 2924/01028* (2013.01); *H01L 2924/01047* (2013.01); *H01L 2924/01079* (2013.01); *H01L 2924/10272* (2013.01); *H01L 2924/12032* (2013.01); *H01L 2924/13091* (2013.01); *H02M 7/003* (2013.01)

(56) References Cited

U.S. PATENT DOCUMENTS

| | | |
|---|---|---|
| 6,627,980 B2 | 9/2003 | Eldridge |
| 7,795,726 B2 | 9/2010 | Myers et al. |
| 7,804,689 B2 * | 9/2010 | Wang ............... H01L 23/473 257/686 |
| 7,911,792 B2 | 3/2011 | Liang et al. |
| 7,928,563 B2 | 4/2011 | Bakir et al. |
| 8,421,235 B2 | 4/2013 | Ide et al. |
| 8,514,901 B2 * | 8/2013 | Kim ............... H01S 3/0407 165/104.11 |
| 8,537,551 B2 | 9/2013 | Ide et al. |
| 8,558,394 B1 | 10/2013 | Chen |
| 8,569,883 B2 | 10/2013 | Hauenstein |
| 9,041,183 B2 | 5/2015 | Liang et al. |
| 9,072,197 B2 * | 6/2015 | Murata ............... H05K 7/20236 |
| 2009/0231811 A1 * | 9/2009 | Tokuyama ............... H01L 23/36 361/699 |
| 2011/0316143 A1 * | 12/2011 | Noritake ............... H01L 21/565 257/713 |
| 2013/0020694 A1 * | 1/2013 | Liang ............... H01L 25/072 257/691 |
| 2014/0225126 A1 * | 8/2014 | Aketa ............... H01L 29/41766 257/77 |

OTHER PUBLICATIONS

Yasuyuki Sakai, et al., Power Control Unit for High Power Hybrid System, SAE Technical Paper, 2007-01-0271, 2007.

Xiaojin Wei, Stacked Microchanel Heat Sinks for Liquid Cooling of Microelectronics Devices, Georgia Institute of Technology Dissertation Presented to the Academic Faculty, 2004.

Calvin R. King, Jr., et al., "3D Stacking of Chips with Electrical and Microfluidic I/O Interconnects," Electronic Components and Technology Conference, 2008, pp. 1-7.

Bing Dang, "Integrated Microfluidic Cooling and Interconnects for 2D and 3D Chips," IEEE Transactions on Advanced Packaging, 2010, pp. 79-87, vol. 33, No. 1.

* cited by examiner

INTEGRATED PACKAGING OF MULTIPLE DOUBLE SIDED COOLING PLANAR BOND POWER MODULES

CROSS REFERENCE TO RELATED APPLICATIONS

This application claims priority to U.S. Provisional Application No. 62/167,371 filed May 28, 2015, which is incorporated herein by reference in its entirety.

The application is also related to U.S. Pat. No. 9,041,183 Granted on May 26, 2015, which is incorporated herein by reference in its entirety.

STATEMENT REGARDING FEDERALLY FUNDED RESEARCH AND DEVELOPMENT

This invention was made with government support under Contract No. DE-AC05-00OR22725 between UT-Battelle, LLC. and the U.S. Department of Energy. The government has certain rights in the invention.

BACKGROUND OF THE INVENTION

1. Technical Field

This invention relates to power electronics modules and systems packaging and more specifically to systems having integrated double sided cooling for improved power density.

2. Related Art

The high standards of power electronics systems in hybrid electric vehicles (HEVs) and in pure electric vehicles (EVs) require significant improvements in cost, reliability, functionality, power density and efficiency. Among these systems are power modules which include power semiconductor switches and module packaging components. The power semiconductor switches such as insulated gate bipolar transistors (IGBTs), metal-oxide semiconductor field-effect transistors (MOSFETs), and diodes may comprise slices made of Si, SiC, or GaN, etc., which are referred to in the field of power electronics as dies or semiconductor dies. These switch dies may be arranged within modules to provide electrical functions in the form of inverter and converter topologies, for example. Module packaging serves to provide electrical interconnections, thermal management and mechanical support to the multiple semiconductor dies. The package components may utilize wire bonding as interconnections within and among the power semiconductor switches.

The criteria used to justify a power module may include cost effectiveness, reliability, functionality, power density and efficiency, etc. All factors may be determined by a set of metrics of electrical, thermal, thermo-mechanical and mechanical performance parameters of power semiconductors and package components, for example, thermal impedance, operation temperature (thermal performance), electrically parasitic resistance/inductance, conductance (electrical performance), power cycling, thermal cycling/shock, vibration ruggedness (reliability), as well as manufacturability (cost).

Improvements to power module packaging are needed to advance the hybrid electric vehicle and electric vehicle products.

SUMMARY

An integrated power electronics building block (assembly) includes one or more planar power modules and coolant control units. The planar power module has an electrical phase leg configuration and double sided heat exchangers. A segmented coolant manifold is interposed between the planar power modules and together create a sealed enclosure that defines the coolant (gas or liquids) circulation path to remove heat. In addition to great improvements of technical parameters, the assembly integrates the functions of electrical conversion and thermal management into one building block.

The planar power module package is comprised of upper power switch dies and lower power switch dies sandwiched between two direct bond copper (DBC) substrates; The two cold plates with pin fins on one side are directly bonded to one outside surfaces of the DBC substrates. The segmented coolant manifold has a coolant inlet, a coolant outlet and a coolant flow path between the inlet and the outlet to circulate a coolant (gas or liquid) about the coolant flow path.

Other systems, methods, features and advantages will be apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

An exemplary power electronics building block (assembly) includes one or more SiC planar power modules. Each planar power module includes a set of SiC power devices in phase leg configuration with attached double sided pin fin heat exchangers. Three planar power packages are assembled together and enclosed within coolant manifolds, which provide a path for circulating a coolant around the planar power packages. The final three-phase assembly provides enhancements in performance parameters, leading to huge improvements in cost reduction, power density increase, reliability enhancement and cost-effective manufacturability, compared to conventional packaging.

Figure 1:
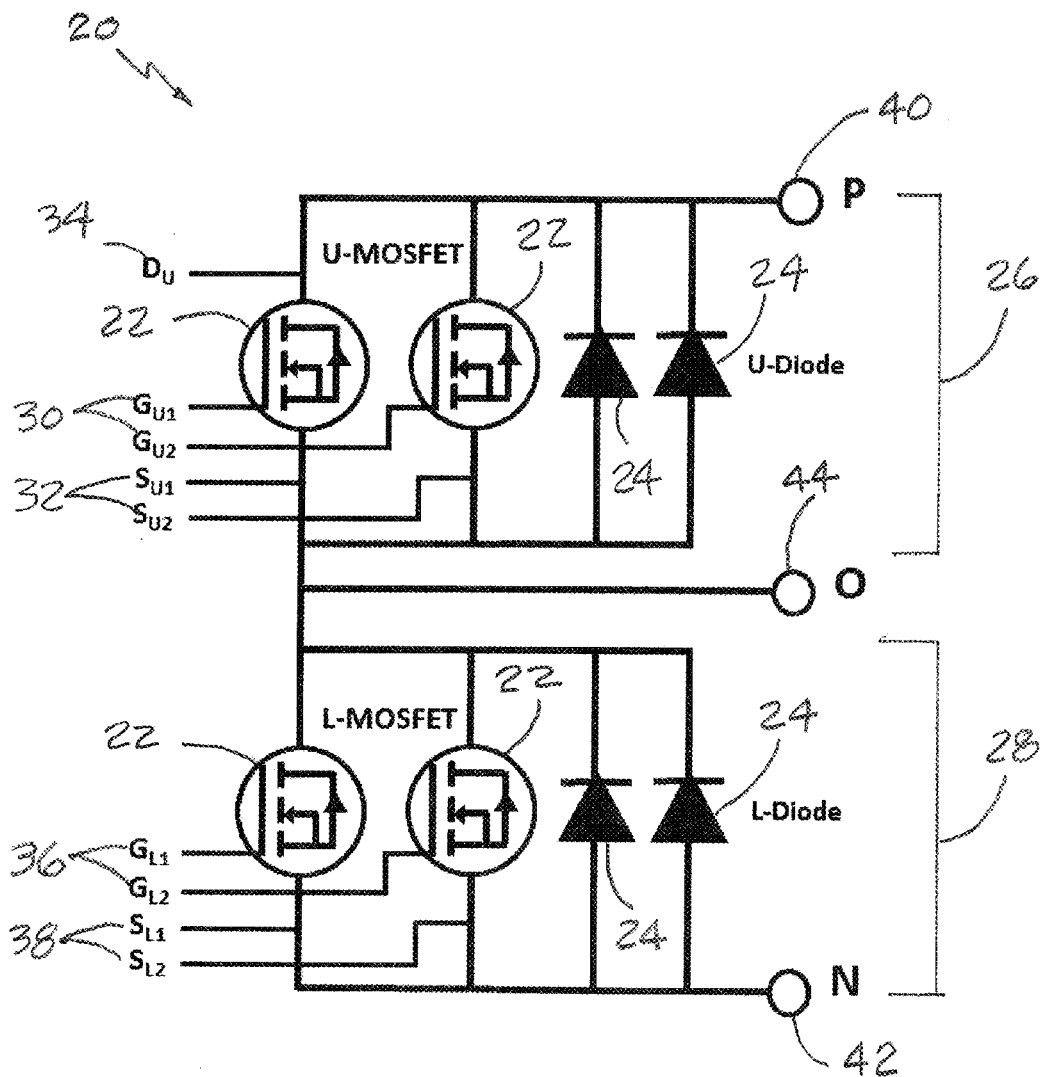
FIG. 1 is a schematic block diagram of an 100 A/1200 V SiC Phase-leg circuit with so called upper devices U-MOSFET, U-diode and lower devices L-MOSFETs and L-diodes.

Referring first to FIG. 1, an all-SiC planar power package 20 is a 100 A/1200 V SiC one-phase-leg configuration, having SiC metal-oxide-semiconductor field-effect transistors (MOSFETs) 22 and SiC Schottky barrier diodes (SBDs) 24, which is a basic circuit for various automotive power converters and inverters. In this particular schematic, two 50 A/1200 V dies are connected in parallel. Power SiC MOSFETs and SBDs are commercially available in the form of bare dies, both with ratings of 50 A and 1200 V. The current rating of the power module can be multiplied by connecting two or more dies in parallel as shown in the schematic. In this example, two MOSFETs 22 and two SBDs 24 are connected in parallel for a 100 A/1200 V phase leg all-SiC power package 20. The switch units include two paralleled bare dies for each switch.

The planar power package 20 is configured with an upper power switch unit 26 and a lower power switch unit 28. Two SBDs 24 are connected in parallel in the upper power switch unit 26 and two SBDs 24 are connected in parallel in the lower power switch unit 28. Also, two MOSFETs 22 are connected in parallel in the upper power switch unit 26 and two MOSFETs 22 are connected in parallel in the lower power switch unit 28. The upper power switch unit 26 may include upper gate leads 30, upper source leads 32 and a drain lead 34. The lower power switch unit 28 may include lower gate signal leads 36 and lower source switching leads 38.

A positive power lead 40, a negative power lead 42 and a neutral power lead 44 are also connected to the power switch units 26, 28 as shown in the figure. Since the power switch semiconductor dies may be orientated in a face-up and/or face-down orientation, the power leads and signal leads may be attached both on the face up side and on the face down side of the power switch semiconductor dies. The planar power package 20 may be utilized as a building block for various electric power converters and/or power inverters having various power ratings and configurations. In some examples three power packages 20 are used; one for each electrical phase.

Figure 2:
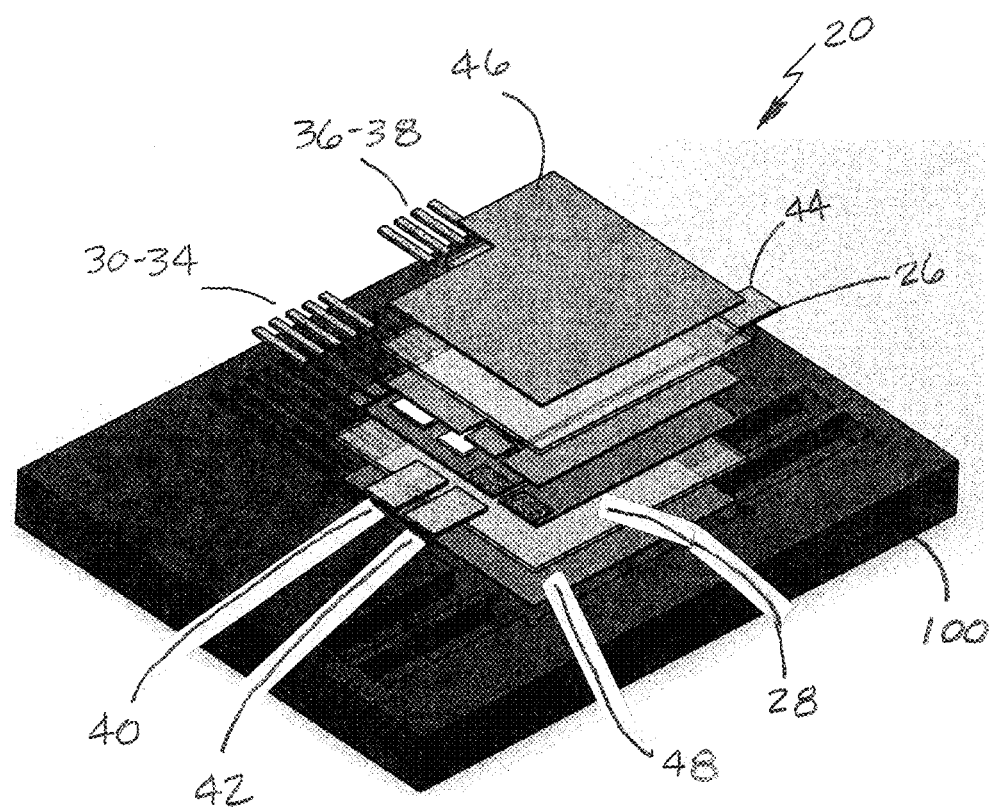
FIG. 2 is an exploded view of an exemplary planar power module with basic elements shown during manufacture.
Figure 3:
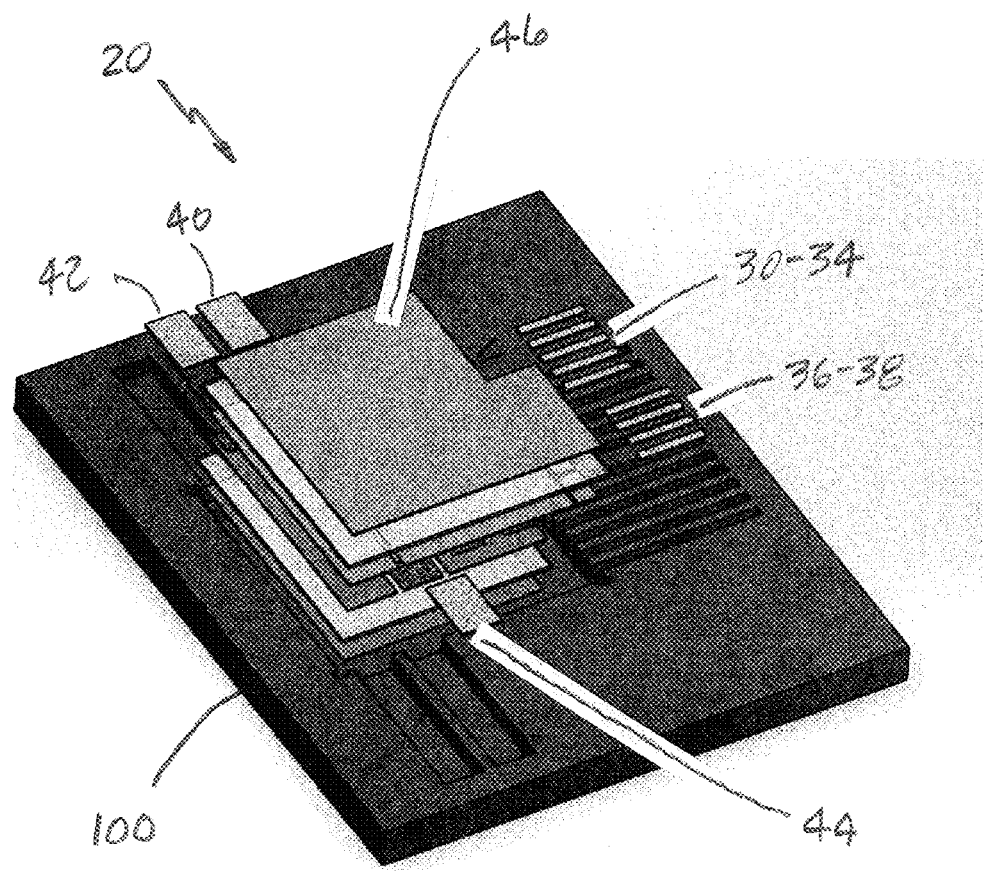
FIG. 3 is an exploded view of an exemplary planar power module of FIG. 2 when viewed from an alternate direction.

FIGS. 2 and 3 are exploded views of an exemplary planar power package 20 positioned above an assembly fixture 100 and prior to subsequent positioning and bonding. The planar power package 20 may include a plurality of power dies having MOSFET dies 22 and SBD dies 24 arranged in a face-up and face-down planar configuration. Here, an upper power switch 26 and a lower power switch 28 pair may be positioned in or on a plane in a face-up and face down orientation relative to a vertical semiconductor structure. Electrical interconnection among the switch dies may be achieved by bonding the switch dies to two (top and bottom) copper (Cu) substrates 46 and 48, which may be patterned to match with a pad layout on the semiconductor dies.

This top and bottom layout of electrodes provides for a main power loop to be situated in the vertical X-Z plane (substantially normal to the die surface) rather than the typical horizontal X-Y plane in which the side by side semiconductor dies lie. This results in a dramatically reduced enclosed loop area since the thickness of a switch die is in the range 0.1 mm, compared to its length and width of approximately 10 mm. This reduction in the enclosed area of the main power loop enables a significant reduction in electrically parasitic inductance. Also, electric resistance is reduced in the main power loop because of larger bond areas and Cu trace conduction, for example, relative to aluminum (Al) bonded wire configurations. In some systems, none of the power switch interconnections utilize bonding wire connections and all the external die interconnections are through the bonded planar substrate material, power leads and signal leads.

Due to the face-up and face-down planar orientations of the power stage dies 22, 24, the power leads 40-44 and signal leads 30-38 may be attached to the top and bottom sides of the power dies in a parallel planar configuration. For example, in some systems an upper power switch unit gate lead 30, an upper power switch source lead 32, a neutral power lead 44 may be attached to a bottom side of the power dies while a lower power switch unit gate lead 36, a lower power switch source lead 38, a positive power lead 40 and a negative power lead 42 may be attached to a top side of the power stage dies. These power and signal leads may be attached to the power dies via the die attach bonds. The power stage dies 22, 24 and the power and signal leads 40-44 may be electrically interconnected in a planar bond structure to the direct bond copper (DBC) substrate 46 on top of the switch dies 22, 24 and to the direct bond copper (DBC) substrate 46 on the bottom of the switch dies, for example, by soldering and/or sintering.

Figure 4:
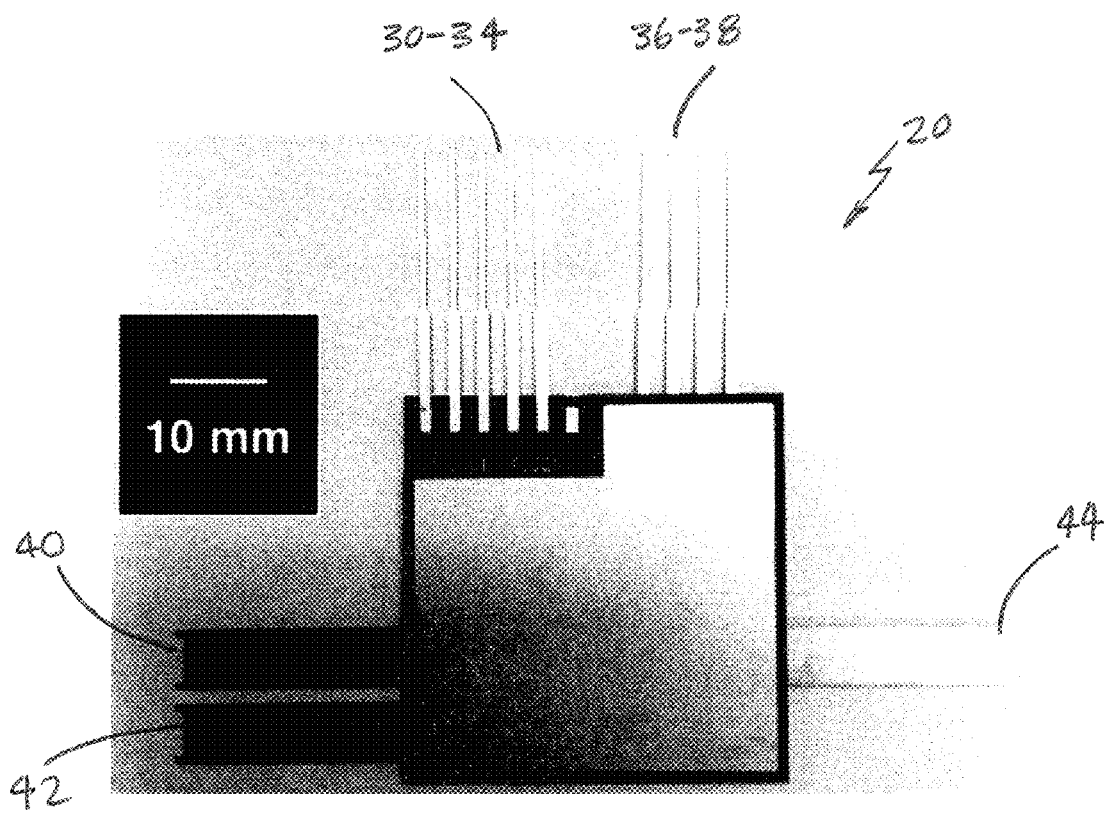
FIG. 4 illustrates an exemplary power module after the basic elements are assembled.

FIG. 4 illustrates an exemplary planar power (module) package 20, such as the one shown in FIGS. 2 and 3, after it is soldered and removed from the assembly fixture 100. Please note that the planar power package 20 is very thin and compact in size.

Figure 5:
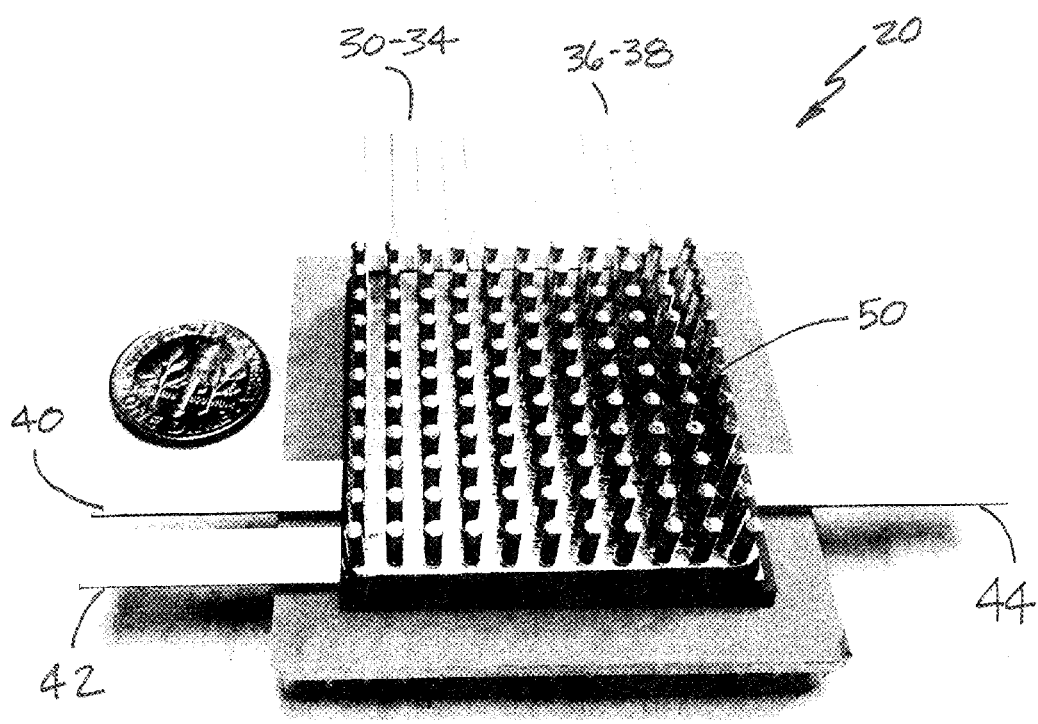
FIG. 5 illustrates an exemplary power module with integrated double sided pin fin heat exchangers and in relation to a coin for comparison.
Figure 6:
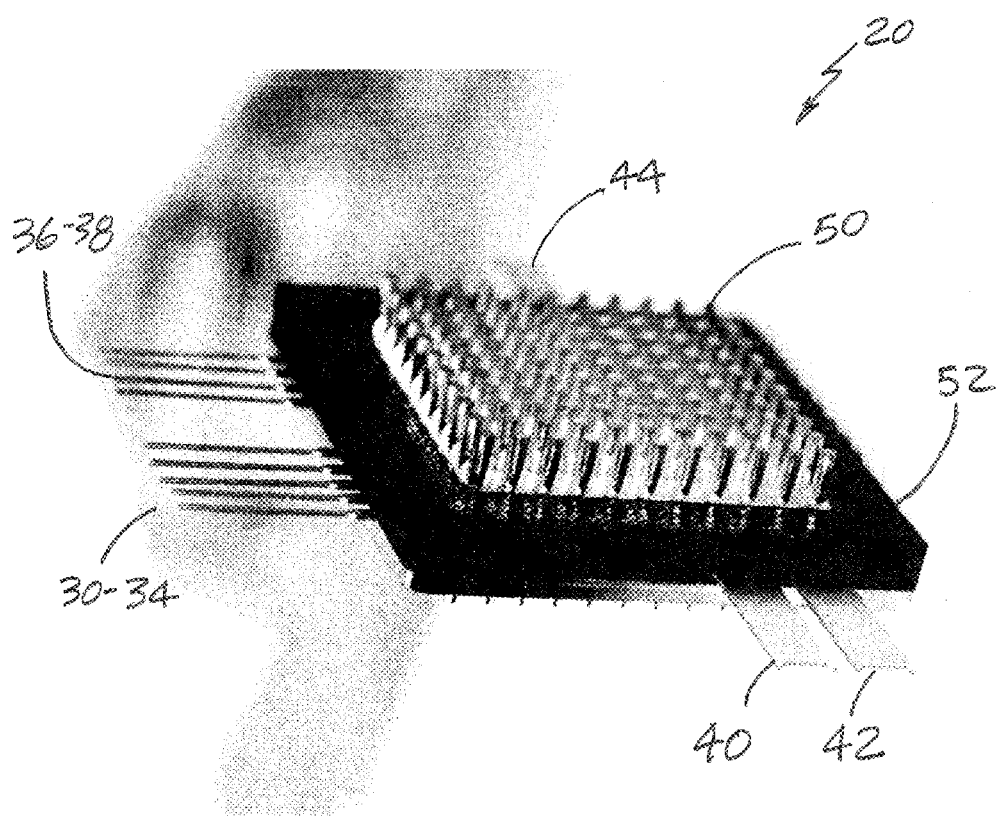
FIG. 6 illustrates the encapsulation added on the exemplary power module of FIG. 5 when viewed from an alternate direction.

FIGS. 5 and 6 illustrate an exemplary power package 20 with integrated double sided pin fin heat exchangers 50 bonded to each side. In the example shown, the individual pins are cylindrical in shape, approximately 1.78 mm in diameter, approximately 7.6 mm in height, and made of copper, although other shapes, sizes and materials having high thermal conductivities and turbulating features are contemplated. In this example, a 11×11 matrix of machined pins is used and a perimeter of encapsulation 52 surrounds the matrix. The encapsulation compound 52 may be a combination of silicone gel and epoxy materials.

Figure 7:
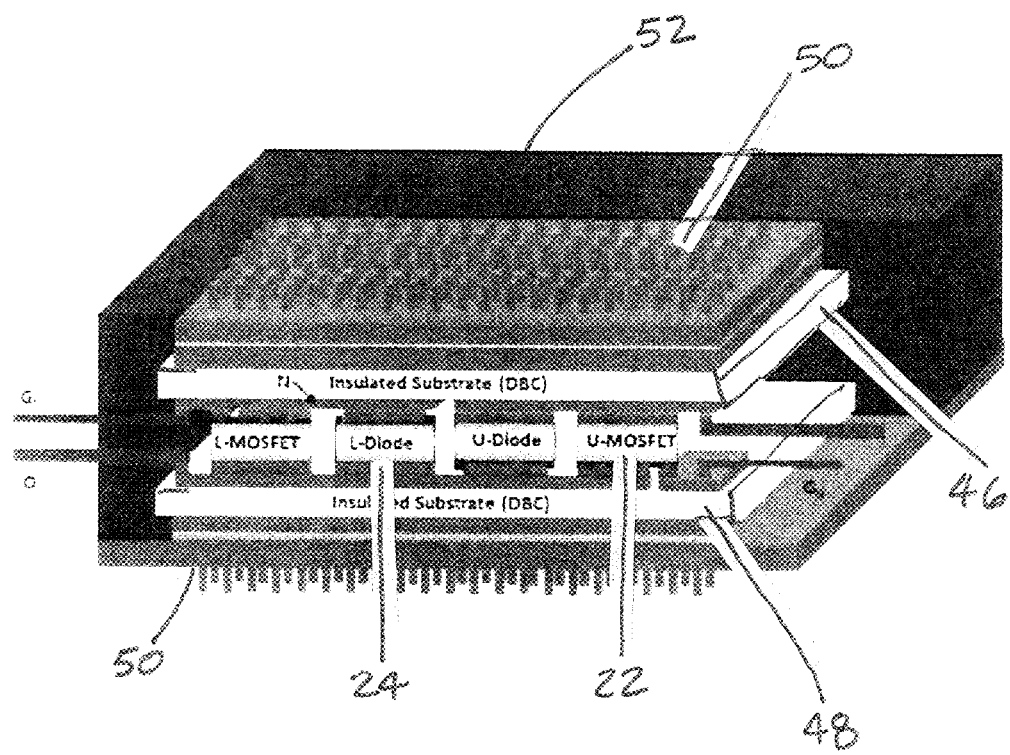
FIG. 7 is a cross sectional schematic of a complete planar power module of FIG. 6 with all components inside.

FIG. 7 is a cross sectional view of an exemplary power module packaging structure 54 which utilizes a top and bottom direct bonded copper substrate 46 and 48 for interconnection. For example, the power module packaging structure 54 may include the power stage 20 and two pin fin heat exchangers 50 which may be directly bonded to the power stage 20 by soldering or sintering. The power stage 20 may include upper and lower power switch units 26, 28, each having parallel MOSFET semiconductor dies 22 and parallel SBD diode semiconductor dies 24. The two power switch units 26, 28 may be arranged physically in a face-up or face down configuration as described earlier. The semiconductor switch dies 22, 24 may be electrically interconnected in a planar structure by bonding the top of the switch dies to a patterned substrate 46 and the bottom of the switch dies to a patterned substrate 48, for example, by soldering and/or sintering to the top and bottom substrates 46, and 48.

The surfaces of the top and bottom substrates 46 and 48 which contact the switch dies may be patterned to register and align with a layout of pads on the top and bottom surfaces of the switch dies 22, 24. The substrates may include direct bond copper (DBC) substrates 46 and 48 which may include electrical insulation in a ceramic slice, sandwiched inside of bonded copper material that may provide electrical and/or thermal conduction. Alternatively, the substrates may include direct bond aluminum (DBA) or another metal element in place of the copper.

For example, in some systems, a negative power lead 42, lower gate signal leads 36 and lower source switching leads 38 may be attached to a top side of the face-up, lower power switch unit, semiconductor dies 22 and 24. A positive power lead 40, upper drain lead 34, upper gate signal leads 30 and upper source signal leads 32 may be attached to a top side of the face-down, upper power switch unit semiconductor dies 22 and 24. A neutral power lead 44 may be attached to the bottom side of the face down, lower power switch unit semiconductor dies 22 and 24 and to the bottom side of the face down, upper power switch unit semiconductor dies 22 and 24. This configuration is merely exemplary and other configurations are also contemplated.

Die attach bonds between the semiconductor dies 22, 24 and the substrates 46 and 48 and between the substrates 46 and 48 and the pin fin heat exchangers 50 respectively may be made by planar bonding materials and associated processing in a bonding method. Exemplary bonding methods may include solders and soldering, silver (Ag) and sintering, as well as solid and/or liquid diffusion bonding. In some systems, all the bond layers in the power module packaging structure 54 may utilize the same bonding method of material and/or processing for a simplified manufacturing process. Top metallization on the semiconductor switch dies 22 and 24 may be different from what would be utilized in dies that are interconnected via aluminum (Al) bonding wires. For example, a wafer level special metallization may include silver (Ag), gold (Au) and/or nickel (Ni).

This planar bond structure of the switch dies 22, 24 may expose top substrate surfaces as extra thermal paths to the directly bonded integrated pin fin heat exchangers 50. In this manner, heat removal from hot power switches may be much improved by double sided cooling, for example, with a forced air or liquid cooling technique. An extra top cooling surface relative to wire bonded semiconductor dies, adds a large heat transfer path and the use of direct bonding instead of stacking through base plate and thermal insulator material (TiM) also reduces a thermal resistance in each thermal path to provide superior cooling of the power stage 20 for reduced temperature and increased power density.

Figure 8:
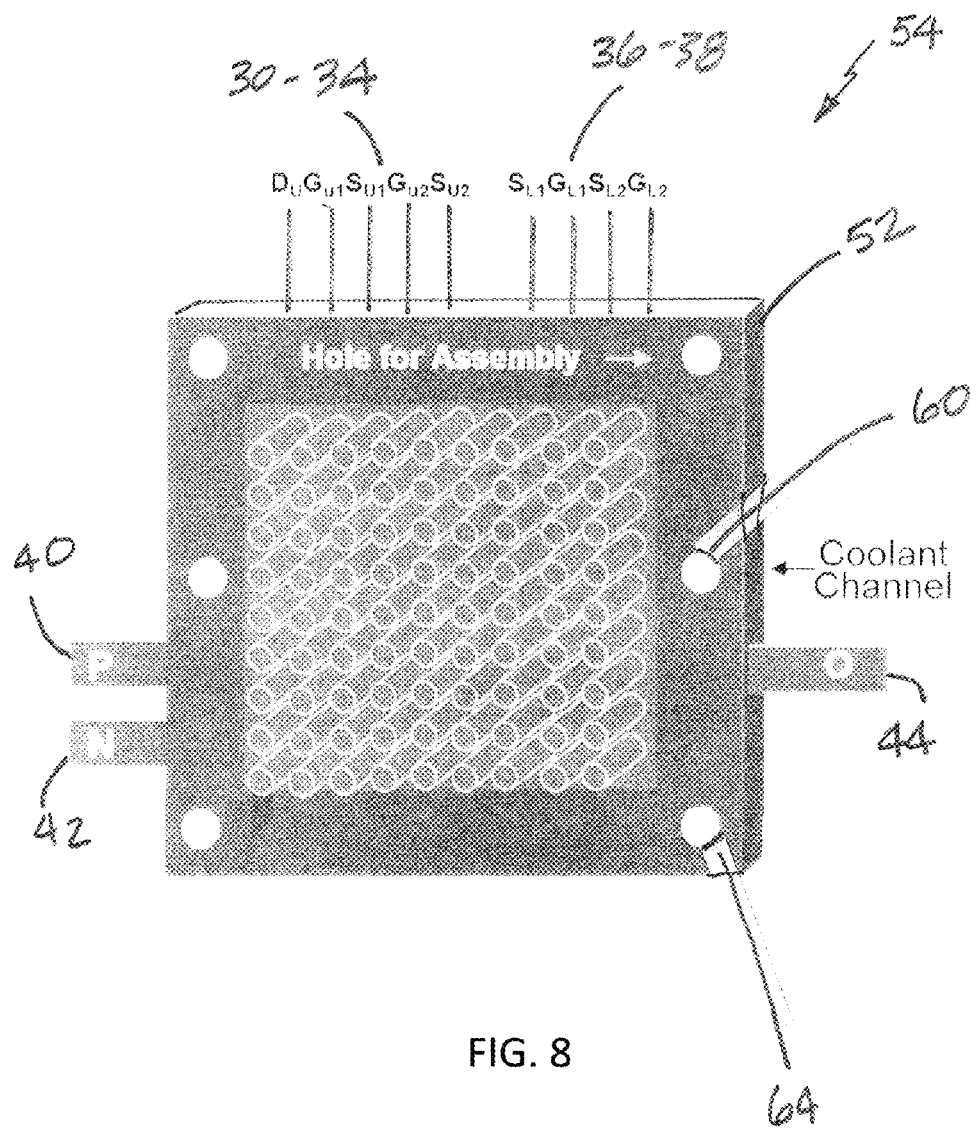
FIG. 8 is a top view of a planar power module with via holes for assembly and coolant channels.

FIG. 8 illustrates a front view of a planar power package 20 with encapsulation 52. Here, the signal leads 30-38, exit the top, the positive power lead 40 and negative power lead 42 exit the left side and the neutral lead 44 exits the right side. Via holes 66 in the power package 20 aligns with coolant channels 60 and also defines a portion of the coolant path 62 when the power module packaging structure 54 is seamlessly assembled through via holes 64.

Figure 9:
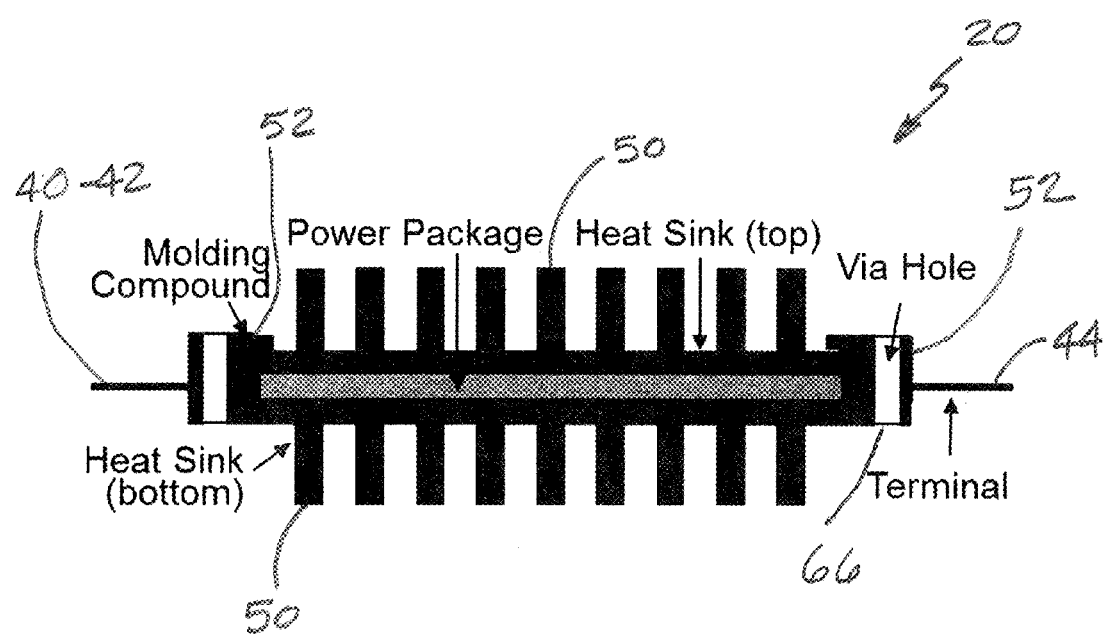
FIG. 9 is a cross sectional view of a planar power module of FIG. 8.

FIG. 9 illustrates a cross sectional view of the planar power package 20 and encapsulation 52. Upper and lower pin fin heat exchangers 50 provide turbulating features for contacting the liquid coolant and removing heat from the planar power package 20. The voids between the individual pins define a portion of the coolant path 62.

Figure 10:
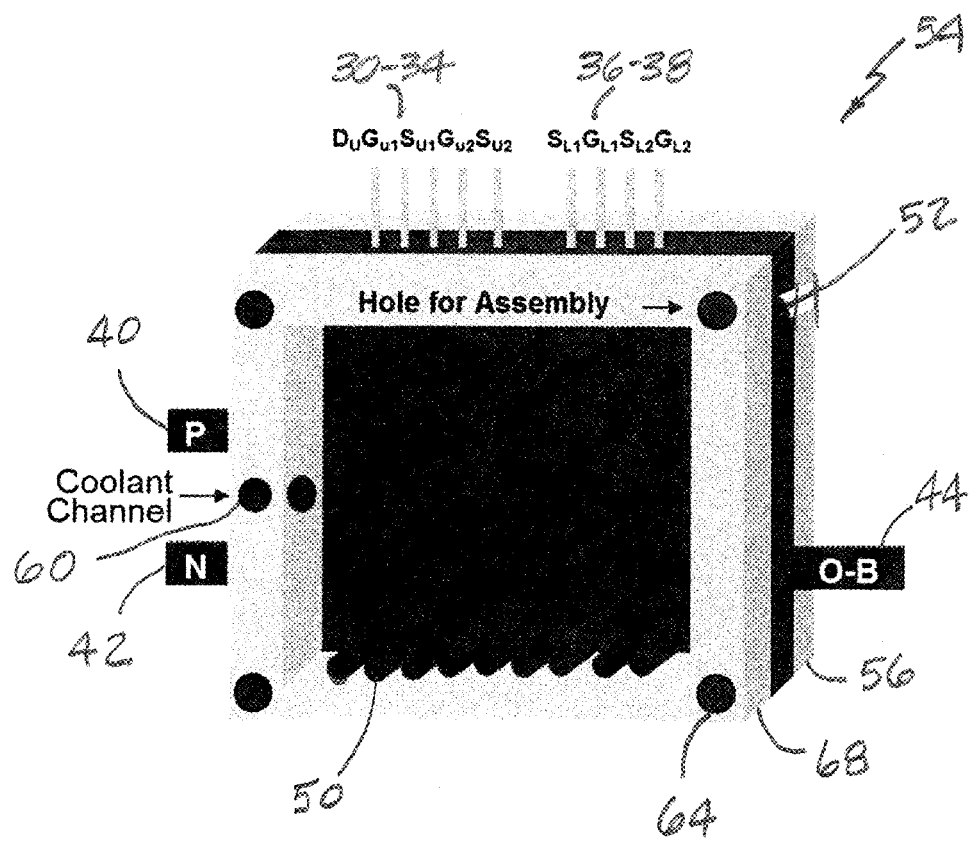
FIG. 10 is a front view of a planar power module and coolant manifolds assembly from front and back of the module of FIG. 8.

FIG. 10 illustrates a partially-assembled, front view of a planar power package 54 installed between two central segments 68 and 56 of a coolant manifold configuration. Here, the signal leads 30-38, exit the top, the positive power lead 40 and negative power lead 42 exit the left side and the neutral lead 44 exits the right side. Coolant channel holes 60 are defined by the manifold segments 68 and 56 and define a portion of the path 62 for the liquid coolant to flow around the power package 54 to remove heat. Assembly holes 64 align with the assembly holes on the other segments 56, 68.

Figure 11:
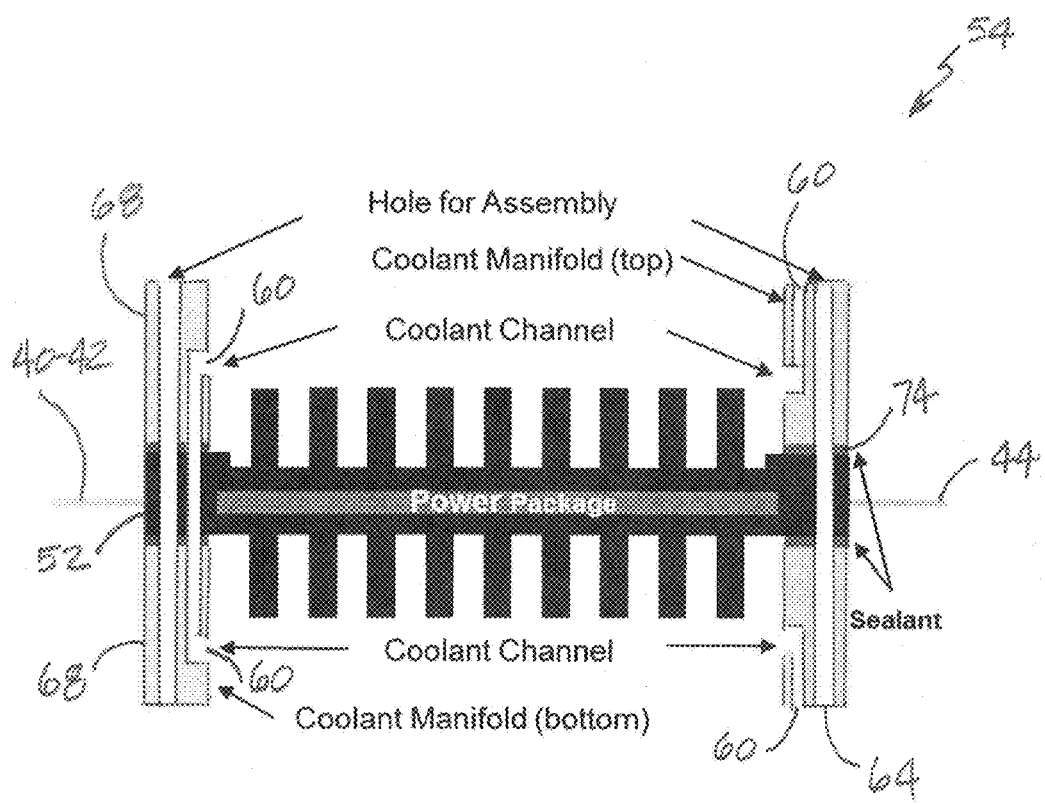
FIG. 11 is a cross sectional view of a planar power module and coolant manifolds assembly of FIG. 10.

FIG. 11 illustrates a cross sectional view of the assembly of FIG. 10, the planar power package 20 and encapsulation 52 in relation to central segments 68 of the coolant manifold module 58. Upper and lower pin fin heat exchangers 50 provide effective features for removing heat from the planar power package 20. The voids between the individual pins define a portion of the coolant path 62. Coolant channel holes 60 are defined by the manifold module 58 and provide a path 62 for the liquid coolant to flow around the power package 20 to remove heat. Assembly holes 64 align with the assembly holes on the two end segments 56.

Figure 12:
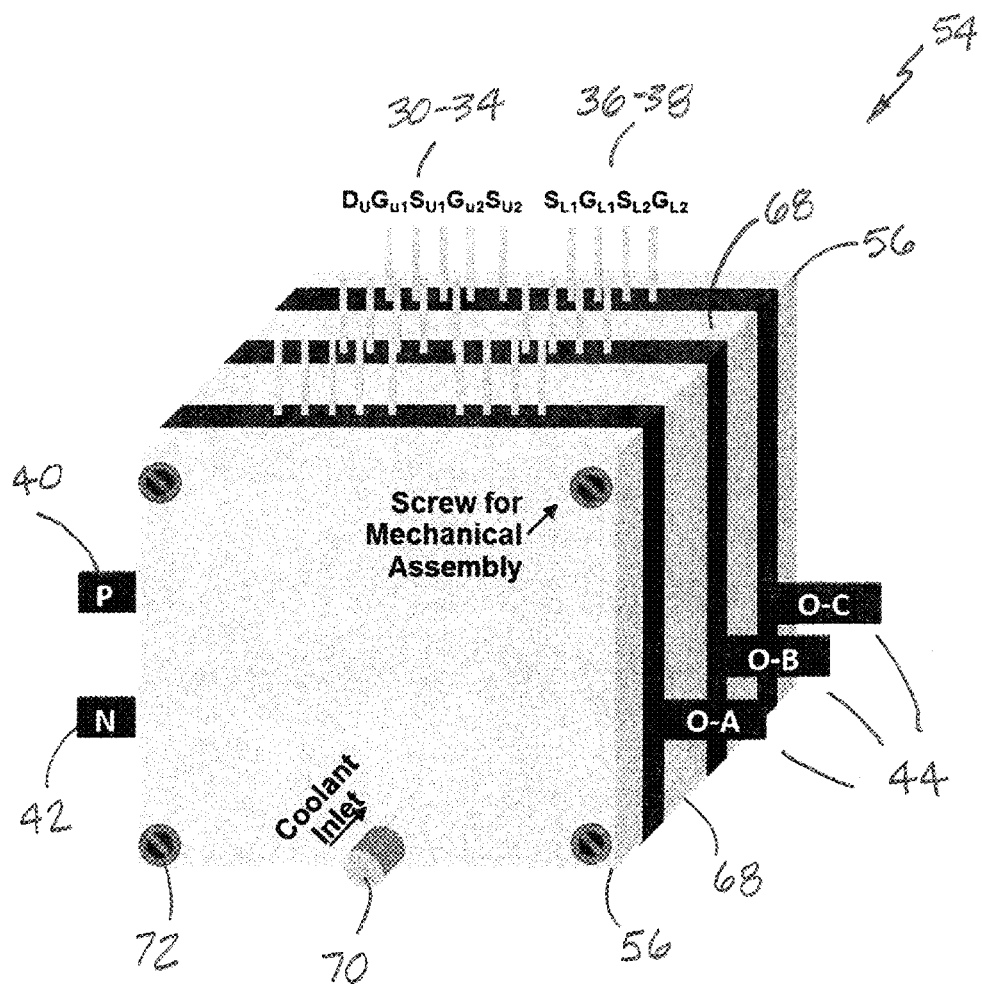
FIG. 12 is a front view of three planar power modules and a set of coolant manifolds assembled together.

FIG. 12 illustrates a fully-assembled integrated power module packaging structure 54 including three individual phase-leg power modules 20, coolant manifold end segments 56 and coolant manifold central segments 68. Here, the three sets of signal leads 30-38 exit the top, the three sets of positive power leads 40 and three sets of negative power leads 42 exit the left side and the three sets of neutral leads 44 exit the right side. A coolant inlet 70 is defined by an end segment 56 and defines a portion of the path 62 for a liquid coolant to flow around the power packages 20 to remove heat. Assembly holes 64 in the end segments 56 and central segments 68 align and accept fasteners 72, which compress the coolant manifold module 58 around the planar power modules 20 to form a sealed power module packaging structure 54.

Figure 13:
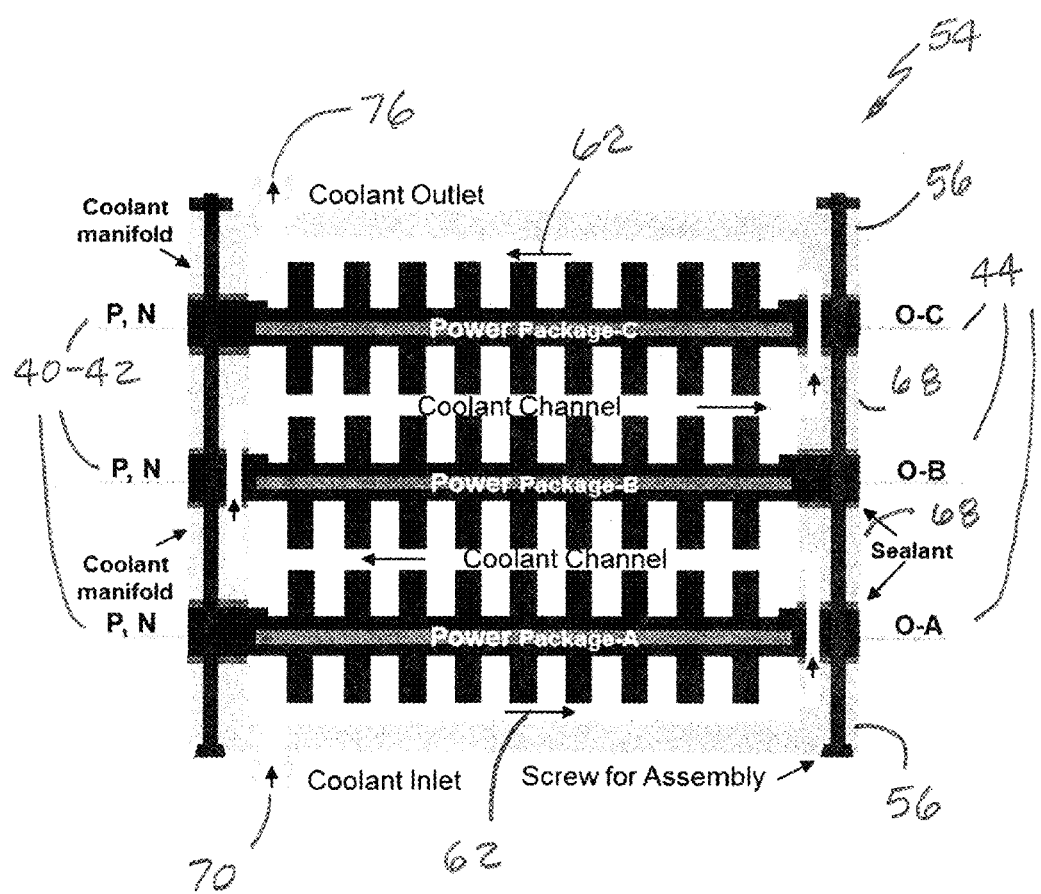
FIG. 13 is a cross sectional view of three planar power modules and a set of coolant manifolds assembly of FIG. 12.

FIG. 13 illustrates a top sectional view of a fully-assembled power module packaging structure 54 including three individual phase-leg power modules 20, interposed coolant manifold end segments 56 and interposed coolant manifold central segments 68. Fasteners 72 join and compress the segments 56, 68 and a sealant 74 such as RTV Silicone disposed between the segments 56, 68 and the power modules 20 ensures a sealed power module packaging structure 54. A coolant outlet 76 is defined by an end segment 56 and defines a portion of the path 62 for a liquid coolant to flow around the power packages 20 to remove heat. The segments 56, 68 may be made of a thermoplastic or a thermoset polymer, or/and metals, for example. In some examples the segments 56, 68 are manufactured by using injection molding or an additive manufacturing process.

While still referring to FIG. 13, the liquid coolant path 62 will be described in greater detail. A liquid coolant first enters the power module packaging structure 54 through a coolant inlet 70 defined by an end segment 56. The coolant then circulates around a pin fin heat exchanger 50 on a first planar power package 20 (right arrow), through a coolant channel 60 in the end segment 56, through a via hole 66 (FIG. 9), and through a corresponding coolant channel 60 in a central segment 68. The coolant then circulates around pin fin heat exchangers 50, on the first and second planar power packages 20 (left arrow). Next, the coolant flows through a coolant channel 60 in a central segment 68, through a via hole 66, and through a coolant channel 60 in a central segment 68. The coolant then circulates around pin fin heat exchangers 50, on the second and third planar power packages 20 (right arrow). Next, the coolant flows through a coolant channel 60 in a central segment 68, through a via hole 66, and through a coolant channel 60 in an end segment 56. The coolant then circulates around a pin fin heat exchanger 50 on the third planar power packages 20 (left arrow). Finally, the coolant exits the power module packaging structure 54 through a coolant outlet 76 defined by an end segment 56. In some examples, the liquid coolant path 62 is reversed. In other examples, the coolant follows several parallel paths 62, from left to right or right to left, instead of a series path 62 as shown.

Figure 14:
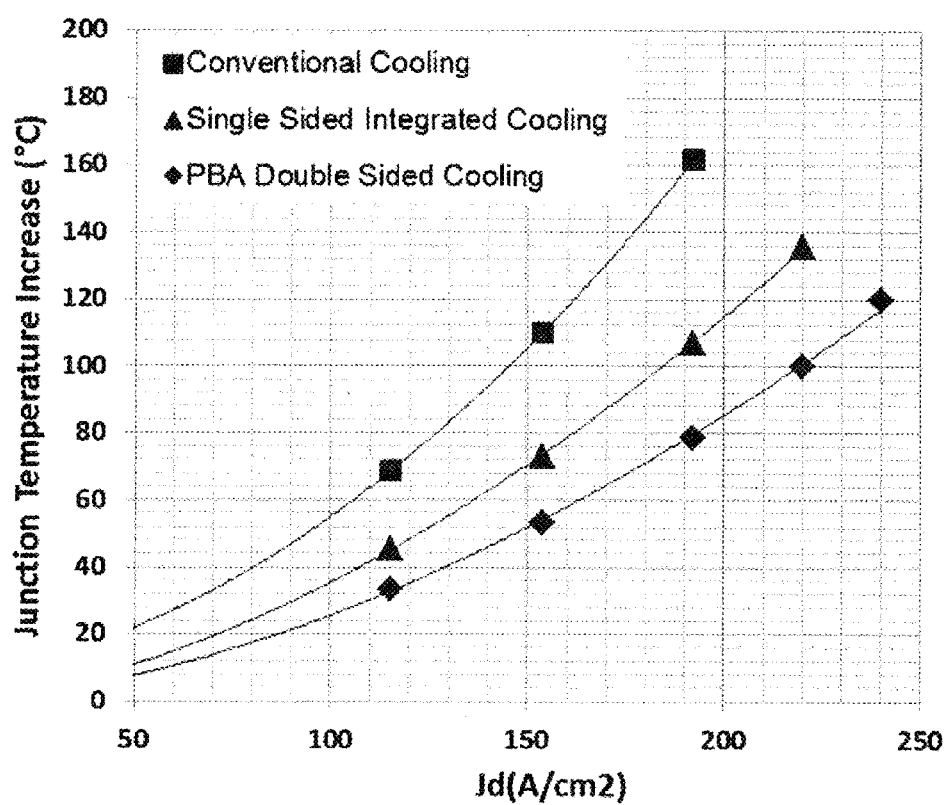
FIG. 14 is a graph illustrating the juncture temperatures versus current density of two prior art power module packages in comparison to the inventive power module package.

It is specifically noted that each of the planar power packages 20 is cooled on each side by the circulating coolant. The pin fin heat exchangers 50 create turbulence in the liquid coolant and increase the heat transfer coefficients between the planar power packages 20 and the liquid coolant. A reduction in operating temperature increases the power density of the power module packaging structure 54 as illustrated in FIG. 14. Here, we see a comparison of the junction temperature versus current density in the SiC MOSFET with different cooling systems. The lower curve (diamond indices under the legend "PBA Double Sided Cooling") is attributable to the present disclosure. Here, we see the current density (Jd) is about 240 Amperes per Centimeter (A/cm2) when a junction temperature is about 120 degrees Celsius (° C.). This is a significant improvement over the conventional cooled and single-side cooled modules.

The power module packaging structure 54 may be stand-alone or connected to an electrical busbar and a cooling loop. Moreover, two or more power module packaging structures 54 may be connected in series or in parallel to form a specific electrical power conversion topology and/or power requirement. Dedicated or shared external cooling may be easily connected to the modules at the coolant inlet 70 and coolant outlet 76 ports. A coolant such as water, water/glycol mix, oil, and air may be used in a dedicated or shared cooling circuit. In some examples a coolant loop is shared with an electrical motor or internal combustion engine, radiator and a fan. Other coolant loops are also contemplated.

While various embodiments of the invention have been described, it will be apparent to those of ordinary skill in the art that many more embodiments and implementations are possible within the scope of the invention. Accordingly, the invention is not to be restricted except in light of the attached claims and their equivalents. The technology disclosed and claimed herein may be available for licensing exclusively or nonexclusively in specific fields of use by the assignee of record.

What is claimed is:

1. An integrated double sided cooled three-phase power module comprising: three, phase leg planar power packages, each one of the three, phase leg planar power packages having an upper power switch unit and a lower power switch unit directly bonded together and sandwiched between two heat exchangers; a segmented coolant manifold having two central segments and two end segments; wherein the two end segments each include one internal coolant channel and wherein the two central segments each include two internal coolant channels surrounding the three, phase leg planar power packages to create a sealed enclosure that defines a coolant inlet, a coolant outlet and a coolant flow path that flows between each adjacent two of the of the three, phase leg planar power packages and in series between the inlet and the outlet; and wherein one of the three, phase leg planer power packages, is sandwiched between two central coolant manifold segments and two of the three, phase leg planer power packages are each sandwiched between a central coolant manifold segment and an end coolant manifold segment.

2. The cooled power module of claim 1 wherein each power switch unit includes a SiC metal-oxide-semiconductor field-effect transistor (MOSFET) and a SiC Schottky barrier diode (SBD).

3. The cooled power module of claim 2 wherein each power switch unit includes two SiC metal-oxide-semiconductor field-effect transistors (MOSFETs) arranged in parallel and two SiC Schottky barrier diodes (SBDs) arranged in parallel.

4. The cooled power module of claim 1 wherein the heat exchangers are pin fin heat exchangers that are directly bonded to each planar power package from dual sides.

5. The cooled power module of claim 1, wherein the coolant flow path direction is controlled by the segmented coolant manifold.

6. The cooled power module of claim 1 wherein the current density (Jd) is about 240 Amperes per Centimeter (A/cm$^2$) when a SiC Mosfet junction temperature is about 120 degrees Celsius (° C.).

7. The cooled power module of claim 1 and further comprising a coolant disposed in the coolant flow path and wherein the coolant is selected from the group consisting of water, water/glycol mix, oil, and air.

8. The cooled power module of claim 1 wherein the direct bonds are formed by soldering, sintering, solid diffusion bonding or liquid diffusion bonding.

9. The cooled power module of claim 1 wherein the upper power switch unit and a lower power switch unit are arranged in a face-up and face-down configuration and sandwiched between two patterned DBC substrates.

10. The cooled power module of claim 1 and further comprising a sealant material bonded between said planar power packages and said segmented coolant manifold.

11. A method of cooling a three-phase power module comprising the steps of:
   a) providing three, phase leg planar power packages, each one of the three phase leg planar power package having an upper power switch unit and a lower power switch unit directly bonded together and sandwiched between two heat exchangers;
   b) surrounding the three, phase leg planar power packages with a segmented coolant manifold so that one of the three, phase leg planer power packages, is sandwiched between two central coolant manifold segments and two of the three, phase leg planer power packages are each sandwiched between a central coolant manifold segment and an end coolant manifold segment to create a sealed enclosure that defines a coolant inlet, a coolant outlet and a coolant flow path that flows between each adjacent two of the of the three, phase leg planar power packages and in series between the inlet and the outlet; and wherein the two central segments each include two internal coolant channels and each end segment includes one internal coolant channel;
   c) Circulating a coolant about the coolant flow path.

12. The method of claim 11 wherein the providing step includes two heat exchangers having pin fins extending outward from the planar power packages and into the coolant flow path.

13. The method of claim 11 wherein the circulating step includes a coolant flow path that traverses through a coolant channel defined by one or more segments of the segmented coolant manifold.

14. The method of claim 11 wherein the circulating step circulates a coolant selected from the group consisting of water, water/glycol mix, oil, and air.

\* \* \* \* \*